(12) United States Patent
Laermer et al.

(10) Patent No.: US 6,372,656 B1
(45) Date of Patent: Apr. 16, 2002

(54) METHOD OF PRODUCING A RADIATION SENSOR

(75) Inventors: Franz Laermer; Wilhelm Frey, both of Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/406,272

(22) Filed: Sep. 24, 1999

(30) Foreign Application Priority Data

Sep. 25, 1998 (DE) .......................................... 198 43 984

(51) Int. Cl.$^7$ ............................................. H01L 21/302
(52) U.S. Cl. ........................ 438/719; 438/723; 438/745; 438/753
(58) Field of Search ................................. 438/719, 745, 438/753, 54, 55, 104; 250/352, 338.1, 338.2, 332

(56) References Cited

U.S. PATENT DOCUMENTS

| | | | | |
|---|---|---|---|---|
| 4,111,717 A | * | 9/1978 | Baxter | 136/214 |
| 4,310,380 A | * | 1/1982 | Flamm et al. | 438/719 |
| 5,056,929 A | * | 10/1991 | Watanabe et al. | 374/181 |
| 5,421,958 A | * | 6/1995 | Fathauer et al. | 216/48 |
| 5,501,893 A | * | 3/1996 | Laermer et al. | 428/161 |
| 5,523,564 A | * | 6/1996 | Yamada et al. | 250/338.4 |
| 5,583,058 A | * | 12/1996 | Utsumi et al. | 438/55 |
| 5,876,497 A | * | 3/1999 | Atoji | 117/85 |
| 5,962,854 A | * | 10/1999 | Endo | 250/349 |

FOREIGN PATENT DOCUMENTS

| | | |
|---|---|---|
| DE | 41 02 524 | 8/1991 |
| DE | 41 29 206 | 3/1993 |
| DE | 42 41 045 | 5/1994 |
| DE | 197 52 926 | 6/1999 |

* cited by examiner

Primary Examiner—Benjamin L. Utech
Assistant Examiner—Duy-Vu Deo
(74) Attorney, Agent, or Firm—Kenyon & Kenyon

(57) ABSTRACT

A method of producing an infrared sensor on a semiconductor substrate involves defining at least one area on the surface of the semiconductor substrate where a recess is to be created in the semiconductor substrate, depositing a membrane on the surface, applying a radiation absorber to the membrane in the defined area, applying thermoelements with a hot contact in thermal contact with the radiation absorber and a cold contact in thermal contact with the semiconductor substrate. In this method, an opening is provided in the membrane in the defined area, and the semiconductor substrate is etched through the opening.

13 Claims, 5 Drawing Sheets a)

b)

c)

d)

a)

b)

c)

d)

a)

b)

c)

d)

METHOD OF PRODUCING A RADIATION SENSOR

FIELD OF THE INVENTION

The present invention relates to a method of producing radiation sensors, in particular for infrared radiation, with an absorber for the radiation to be measured and a plurality of thermoelements for measuring the absorbed radiation-induced heating of the radiation absorber integrated into a semiconductor substrate. These methods can be used in particular for production of radiation absorbers with a plurality of sensor elements integrated at small distances on a substrate.

BACKGROUND INFORMATION

Such a radiation sensor with a plurality of sensor elements and a method of producing same are described, for example, by I. H. Choi and K. D. Wise, "A Linear Thermopile Infrared Detector Array with On-Chip Multiplexing," IEEE Trans Electron. Devices (September 1985), pages 132 through 135. This article describes a method whereby boron is diffused into a <100> oriented silicon substrate in a ring pattern from the front side, a membrane of $SiO_2$ and $Si_3N_4$ is created on the front side, and then openings are cut through the substrate from the rear side of the substrate by anisotropic wet etching. These openings end on the front side of the substrate within the ring-shaped areas doped with boron. This forms openings in the substrate that are closed only by the thin membrane. A radiation absorber is formed on the membrane in each of these openings. A plurality of thermoelements connected in series each has a hot contact in the vicinity of the radiation absorber and a cold contact on the remaining silicon substrate which functions as a heat sink.

This known manufacturing method has a number of disadvantages. The anisotropy of wet etching occurs due to the fact that the etching process takes place at different rates on the different crystal faces of the silicon substrate. The etching rate is lowest on a surface with <111> orientation. Therefore, in wet etching of a <100>surface through an opening in a mask, a recess is formed in the surface, its side walls having <111>orientations and being inclined at an angle of approx. 54° to the <100> surface. The bottom surface of the resulting recess is smaller the further the etching operation proceeds into the material, until it reaches a depth where the opposite walls of the recess abut against one another. Therefore, to produce a small opening at the level of the membrane, a mask with a much larger opening must be formed on the opposite side of the substrate.

Fluctuations in thickness between different substrates or within a substrate have a critical effect on the dimensions of the opening produced in the membrane due to the inclined orientation of the walls. It is extremely difficult to produce precision openings with small dimensions in relation to the thickness of the substrate, because fluctuations in the thickness of the substrate have a great influence on their size.

This problem is counteracted in the cited literature by the diffused ring made of boron. The boron-doped material is not attacked by etching, so the opening in the mask on the rear side of the substrate can be larger than would be necessary in view of the crystal geometry of the substrate to obtain a given opening size in the membrane. The size of the finished opening is then determined by the diameter of the undoped region inside the boron-doped ring. However, one unavoidable consequence of this method is that a portion of the rear side of the boron-doped ring which has diffused into the substrate is exposed so that the thickness of the substrate in the immediate vicinity of the opening after etching is determined by the thickness of the ring, which amounts to only approx. 20 µm. Although a greater ring thickness could be achieved, this would be possible only through long diffusion times at very high process temperatures. This leads to the problem that, in the finished infrared sensor, the boron-doped ring may be eroded to varying extents by the etching process, resulting in variations in the quality of heat transfer from the cold contacts of the thermoelement over the ring into the solid silicon substrate, which can lead to systematic measurement errors.

Another radiation sensor with a silicon substrate, a radiation absorber arranged on a membrane over an opening in the substrate and a plurality of thermoelements with a hot contact in the vicinity of the radiation absorber and a cold contact on the silicon substrate is known from German Published Patent Application No. 41 02 524. With this sensor, the walls of the opening also diverge toward the side of the substrate facing away from the membrane in the manner characteristic of anisotropic wet etching. The diameter of the opening is much greater than the thickness of the substrate.

SUMMARY OF THE INVENTION

The present invention provides methods of producing radiation sensors which make it possible to produce radiation sensors with precisely reproducible properties and permit the production of radiation sensors with a plurality of individual sensor elements which can be arranged at a small distance from one another, which is independent of the thickness of the substrate used.

According to a first aspect of the present invention, these advantages are achieved by the steps of forming an opening in the membrane in the specified area and etching the semiconductor substrate through this opening. This opening makes it possible to produce the required cavity below the radiation absorber from the front side of the substrate, thus eliminating the necessity of etching through the entire substrate in a time-consuming process. This eliminates possible sources of error in positioning the etching mask on the rear side of the substrate in relation to the position of the radiation absorber, as would otherwise be necessary; there is no danger of extensive etching beneath the edge areas of the opening where cold contacts of the thermoelement can be mounted, which would thus result in poor thermal contact with the solid silicon substrate; furthermore, there may be solid unetched semiconductor material a short distance below the radiation absorber, which increases the total mass of the heat sink formed by the semiconductor material.

According to a first variant of this method, wherever a recess is to be created, the semiconductor material is made porous in that area prior to deposition. This can be accomplished by an anodic oxidation, e.g., with an HF electrolyte, in an electrochemical process in which the wafer functions as the anode with respect to the electrolyte. This region, which has been made porous, can then be etched out selectively in a subsequent etching step.

This etching step preferably takes place after the membrane has been deposited and the thermoelements have been structured on the membrane.

To determine the area to be etched out, in this case the surface of the semiconductor substrate is preferably masked with a protective layer made of a material which is resistant to the agent used to make the semiconductor porous. This material may be chromium or gold, for example.

As an alternative, the areas to be etched out can be determined by low n-type doping (n⁻ doping) of the areas that are not to be etched away, so that in contrast with the p-doped substrate and any n⁺⁺ doped areas, they are not attacked by the agent used to make the semiconductor porous. The etching step which follows the step of making the semiconductor porous may be a traditional wet etching step.

The thermoelements are preferably structured on the deposited membrane before the etching step.

No special masking is necessary for the etching step if the material to be etched out has been prepared by making it porous.

According to a second variant of this method, no preparation of the area to be etched out by making it porous is necessary, and instead the area to be etched out is determined only by the formation of the opening in the membrane. The recess can be produced easily by isotropic etching of the substrate area behind the opening.

This isotropic etching can be performed by electrochemical anodizing followed by dissolving, by direct electrochemical dissolution or by isotropic wet etching, e.g. HNA (HF+NHO₃+CH₃COOH).

In this second variant, however, dry etching methods are preferred, such as plasma etching or spontaneous dry etching, because gaseous etching media can penetrate more easily than liquid media into the area to be etched away behind the opening, and because the mass exchange through the opening is more effective.

In particular, plasmas of F₂ in Ar, SF₆ or NF₃ may be used for plasma etching.

Gases such as XeF₂, ClF₃ or BrF₃ which erode silicon immediately on coming in contact with it in a violent reaction, forming volatile SiF₄, may be used for spontaneous dry etching.

According to a second aspect of the present invention, a method is to be provided of producing a radiation sensor on a semiconductor substrate by performing the steps of establishing at least one area on a first surface of the substrate, in which an opening is to be created in the substrate, depositing a membrane on the first surface of the substrate, applying a radiation absorber to the membrane, applying thermoelements with a hot contact in thermal contact with the radiation absorber and a cold contact in thermal contact with the semiconductor substrate, and applying a mask to a second surface of the semiconductor substrate (the rear side) which is opposite the first surface. According to this method, the mask has an opening congruent with each area thus determined, and the second surface is treated by anisotropic dry etching until the silicon substrate has been etched away in the areas determined.

Suitable anisotropic dry etching methods are described in German Published Patent Application No. 42 41 045. The plasma etching processes described there make it possible to produce openings in the semiconductor substrate with walls almost perpendicular to its surface, thus eliminating the necessity for making the openings in the etching mask on the second surface of the substrate much larger than the finished openings by including a lead produced later in the substrate at the level of the membrane. Not only does this eliminate possible sources of error in producing and positioning the mask, it also yields the possibility of arranging the individual openings at a much smaller distance from one another which no longer necessarily depends on the thickness of the substrate. The cross-sectional dimensions of the openings in the semiconductor substrate are constant over the thickness of the substrate, so that there are no losses of surface area and a dense packing of openings is possible.

It is readily possible to produce an opening in a substrate up to 700 μm thick merely by anisotropic dry etching as described in the aforementioned publication.

According to two advantageous embodiments of the method, however, the openings are produced in two steps.

In the first embodiment, first a contiguous area of the substrate is eroded by etching, thereby producing the second surface on which the actual etching mask is applied. Any desired etching method, preferably a rapid etching method, can be used for this etching.

As an alternative, dry etching itself may be subdivided into two steps, with etching being performed only in the congruent openings in the mask in the first step and then performed on a contiguous area having several congruent openings. Due to the first step, the congruent openings have a certain "projection" over the contiguous area surrounding them, and this is preserved in the next step of etching the contiguous area.

The result of these two methods is a substrate with a contiguous recessed surface on the rear surface of the substrate and a plurality of openings extending from the surface to the membrane on the front surface of the substrate. The individual openings are separated by webs of semiconductor material, although the thickness of these webs is not that of the original substrate, but it is constant and reproducible for each individual opening, and thus for each individual radiation absorber arranged in such an opening it forms a uniform thermal tie to the heat sink formed by the semiconductor substrate.

To form an effective heat sink, the webs of semiconductor material should be at least 50 μm thick. Etching should thus proceed at least to this depth in the congruent openings. At a high aspect ratio of the openings, it becomes more and more difficult for the material etched away to be removed from the openings, and furthermore, on reaching the membrane, there is the risk of notching at the interface between the semiconductor substrate and the membrane, so it may be expedient to limit the depth of etching in the congruent openings, e.g., to a value of 100 or 200 μm.

A two-layer mask is preferably used for two-step dry etching, with an opening that corresponds to the contiguous area being formed in a first masking layer and with the second layer containing the congruent openings. In the transition between the two etching layers, only the second layer of the mask need be removed selectively. For example, an advantageous combination would be to use photoresist masking and SiO₂ as a hard mask or a nitride oxide layer system such as that described in German Published Patent Application No. 41 29 206.

DETAILED DESCRIPTION

Figure 1:
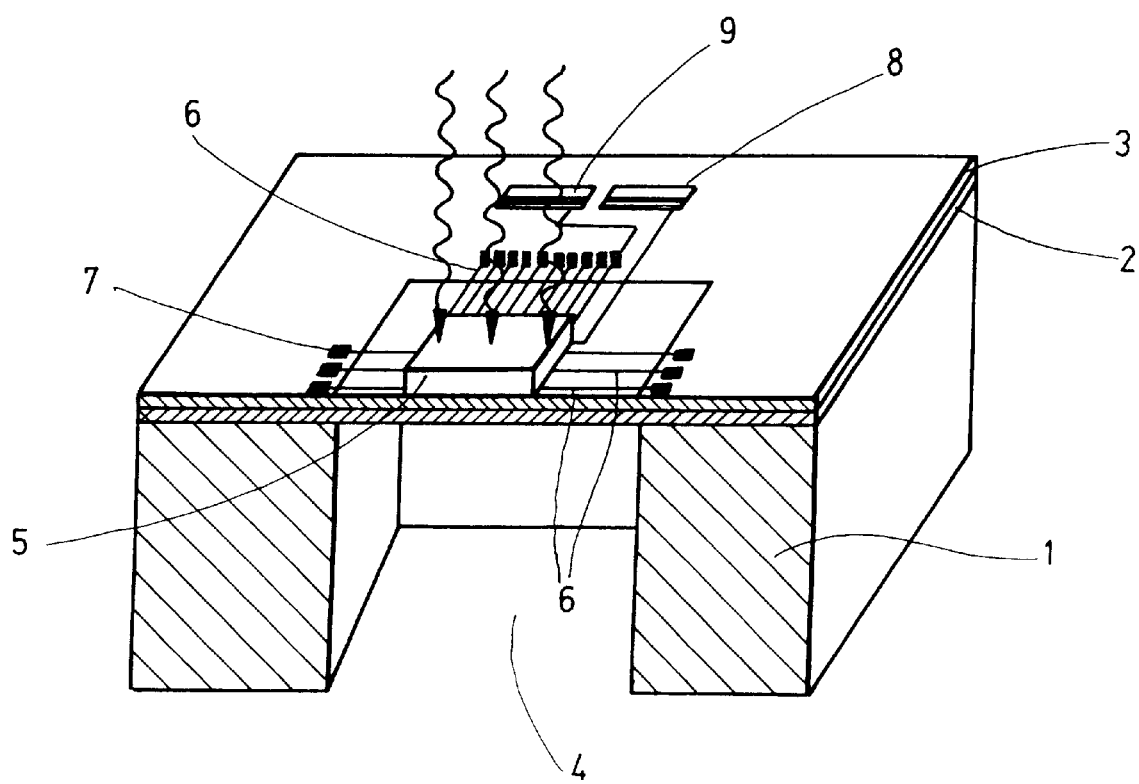
FIG. 1 shows a schematic view of an individual sensor element of a radiation sensor produced according to the present invention.

FIG. 1 shows a schematic diagram of the design of a sensor element of a radiation sensor such as that which can be produced by a method according to the present invention. The complete sensor includes a grid-like arrangement of a plurality of the elements shown in the figure, each separated by webs of substrate material. A semiconductor substrate 1 made of silicon has thin layers 2 of $SiO_2$ and of $Si_3N_4$ on its surface 3, extending as a thin membrane over a recess 4 in the semiconductor substrate 1. Recess 4 may extend as an opening through the entire thickness of semiconductor substrate 1. If the sensor is produced according to one of the methods described below with reference to FIGS. 2 or 3, recess 4 may also be merely an indentation in an otherwise solid substrate.

A radiation absorber 5 is arranged on the membrane over recess 4. It is attached to semiconductor substrate 1 essentially only by the thin membrane made of materials with a relatively poor thermal conductivity and thus it is thermally insulated with respect to the heat sink formed by substrate 1.

Radiation absorber 5 is made of a material such as ultrafine gold particles which will absorb the incident radiation as completely as possible in the largest possible spectral range. When radiation strikes the surface of the sensor, absorber 5 heats up much more than semiconductor substrate 1 surrounding recess 4 due to its high absorbing power, its small thickness, and the thermal insulation.

A plurality of thermoelements 6 extends between "cold" contacts arranged above and in thermal contact with semiconductor substrate 1 and "hot" contacts covered by radiation absorber 5 and therefore not visible in the sensor shown here. The hot contacts are in good thermal contact with radiation absorber 5, but they are not connected to it in an electrically conductive manner. Individual thermoelements 6 are connected in series in the manner known, for example, from German Published Patent Application No. 41 02 524 which has already been cited, so that a voltage which is n times the thermoelectromotive force generated at an individual thermoelement 6, where n represents the number of series-connected thermoelements 6, is obtained as the measurement signal for the temperature difference between radiation absorber 5 and substrate 1. The resulting measuring circuit voltage can be processed further with the help of circuits integrated into the same semiconductor substrate 1 or picked off by means of contact pads 8, 9, as in the case illustrated here.

Figure 2:
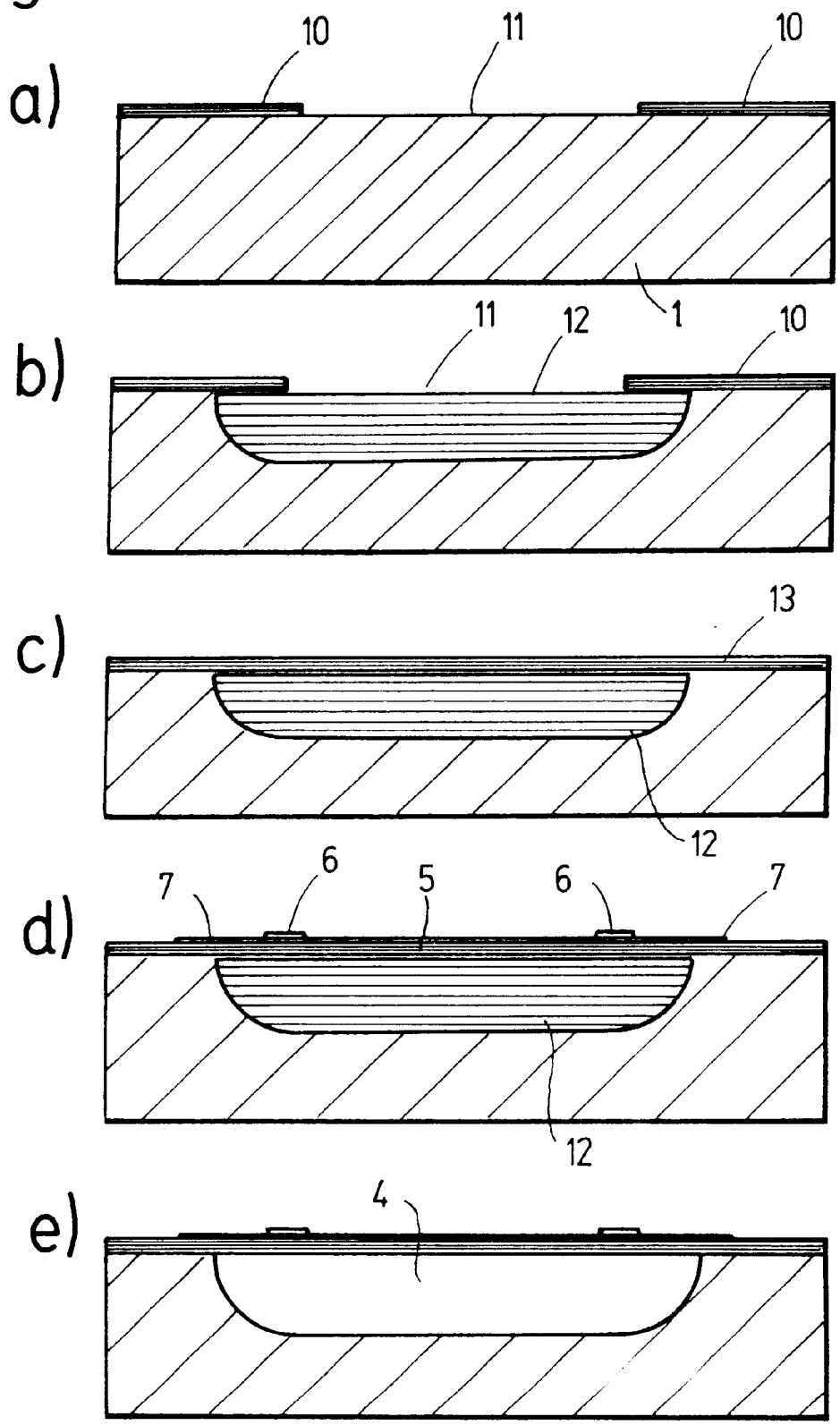
FIG. 2 shows the implementation of different steps in a production process according to the present invention, where a semiconductor substrate is structured from the front side.
Figure 3:
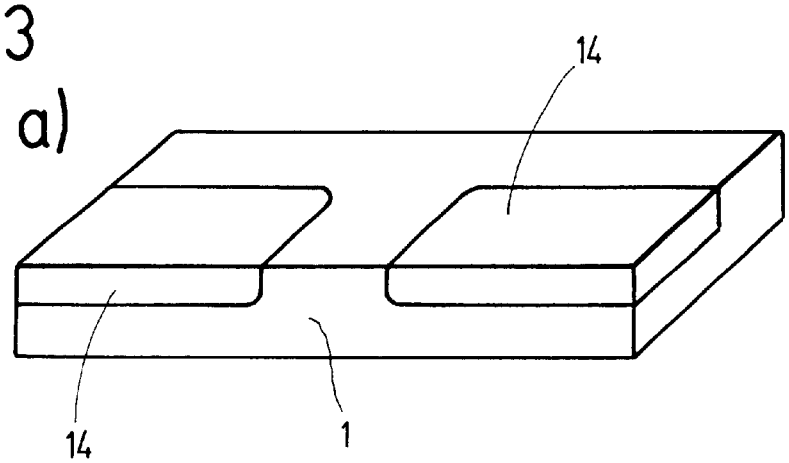
FIG. 3 shows the implementation of steps in a second production process where the semiconductor substrate is structured from the front side.
Figure 3:
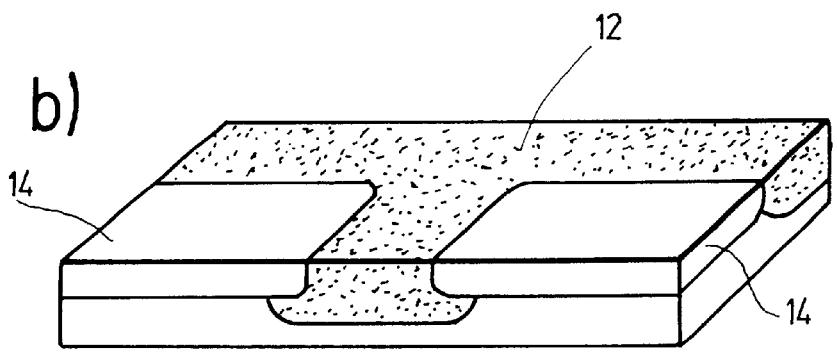
Figure 3:
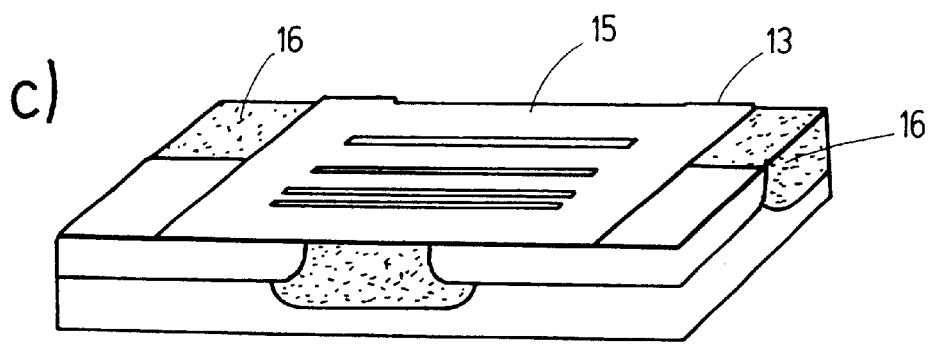
Figure 3:
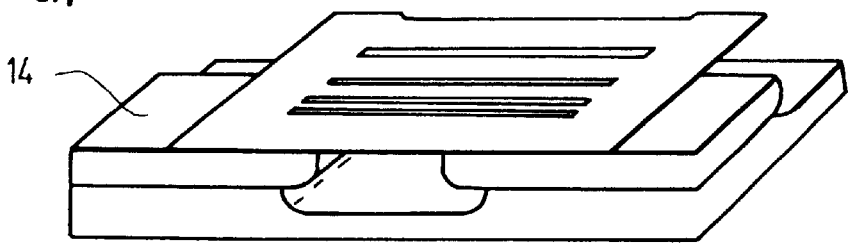

FIG. 2 illustrates different stages in the production of a radiation sensor such as that shown in FIG. 1 in a first method according to the present invention. Stage a shows silicon substrate 1 with a protective layer 10 of gold or chromium that is vapor deposited on the surface. This substrate surface is subjected to anodic oxidation in an HF electrolyte. Protective layer 10 is resistant to attack by the electrolyte, but the exposed silicon of substrate 1 in a window 11 of the protective layer is not resistant. It is attacked in an electrochemical process in the course of anodic oxidation. The substrate is anodic with respect to the electrolyte, i.e., it is under a positive bias voltage, and the electrolyte is connected to the negative pole of a current source. Thus a porous area 12 is formed, its thickness and structure depending on the duration of the anodizing treatment and on such process parameters as the surface amperage, the concentration of the electrolyte, etc. The attack is isotropic, so that porous area 12 also extends below protective layer 10 in an edge zone. FIG. 2b shows the condition of the substrate after completion of this treatment.

In conclusion, protective layer 10 which has fulfilled its function is eroded, and a membrane 13 which may be made of $SiO_2$ and $Si_3N_4$ layers, as illustrated in FIG. 1, is applied to the substrate surface including porous area 12, e.g., by CVD methods, as illustrated in FIG. 2c. Then radiation absorber 5 and thermoelements 6 are deposited on membrane 13. The thermoelements are arranged in such a way that their hot contact comes in contact with radiation absorber 5 and the cold contact is over an area of the substrate surface which is not attacked by anodic oxidation (see FIG. 2d). To prepare for a subsequent etching step, radiation absorber 5 and thermoelements 6 may be covered with a protective layer (not shown).

Before or after applying the radiation absorber and thermoelements, membrane 13 is structured to make the porous silicon accessible to attack by an etching medium in area 12 through an opening formed in the membrane.

The etching may be wet etching, e.g., with dilute KOH, NaOH, ammonia or TMAH (W). The porosity of the material promotes the penetration of the etching medium and the progress of the etching process, so that a recess 4 can be formed quickly at the location of porous silicon.

Instead of wet etching, dry etching methods may also be used, such as isotropic plasma etching in a fluorine plasma, with fluorine radicals that produce isotropic etching of silicon being generated in a plasma discharge. Suitable materials for this purpose include, for example, a plasma of $SF_6$ or $NF_3$ or pure fluorine ($F_2$ in argon). Areas of the substrate surface that are not to be etched may be covered by photoresists, negative resists or silicon dioxide layers, if they are not already protected by the membrane from attack by the etching plasma.

As an alternative to the plasma etching technique, it is also possible to use spontaneously etching chemicals to extensively remove the silicon beneath the membrane passage openings and thus produce exposed membrane areas. To do so, one may use to advantage gases such as xenon difluoride ($XeF_2$), chlorine trifluoride ($ClF_3$) or bromine trifluoride ($BrF_3$). All these gases are absorbed by the silicon surfaces, where they split off fluorine radicals spontaneously, i.e., without any external influence of ions or electrons, and these fluorine radicals etch silicon spontaneously, i.e., isotropically, and can thus produce the recesses beneath the membrane. It is sufficient for this purpose to bring free silicon surfaces in contact with one of these gases, and spontaneous isotropic etching of silicon begins immediately and without external support. Etching rates of several 10 $\mu$m per minute can be achieved, making it possible to create the required recess in a short period of time. These gases are very selective with respect to masking layers, such as a photoresist, silicon dioxide and other protective layers, which may be provided in addition on the substrate to mask sensor areas that are not to be etched.

FIGS. 3a through 3d show the steps of an alternative method of producing recesses in a silicon substrate below a membrane. By masking and ion implantation, n-doped areas 14 are produced in semiconductor substrate 1 shown in FIG. 3, which is made of p-doped silicon with a conductivity of 8 $\Omega$cm, for example.

This substrate is subjected to an anodic oxidation treatment in dilute hydrofluoric acid at its surface. The n-doped areas 14 are not attacked, but a porous layer 12 extending to a depth of approx. 20 μm is formed on the remaining surface of substrate 1.

Then a membrane 13 is deposited on substrate 1 treated in this way and the membrane is structured. The result is illustrated in FIG. 3c. As in the method explained with reference to FIG. 2, a radiation absorber and thermoelements (not shown in this figure for the sake of simplicity) are applied to membrane 13. The arrangement shown in FIG. 3c may be subjected to the same etching methods as those described in conjunction with FIG. 2 above. The etching medium can reach the porous silicon in area 12 through elongated windows 15 in membrane 13 as well as through areas 16 which remain uncovered by the membrane on the side. These areas 16 thus fulfill the function of openings in the membrane from the standpoint of the etching step.

Here again, the etching process proceeds much more rapidly in the porous silicon than in areas 14 which remain solid, so this ultimately yields the structure illustrated in FIG. 3d.

Figure 4:
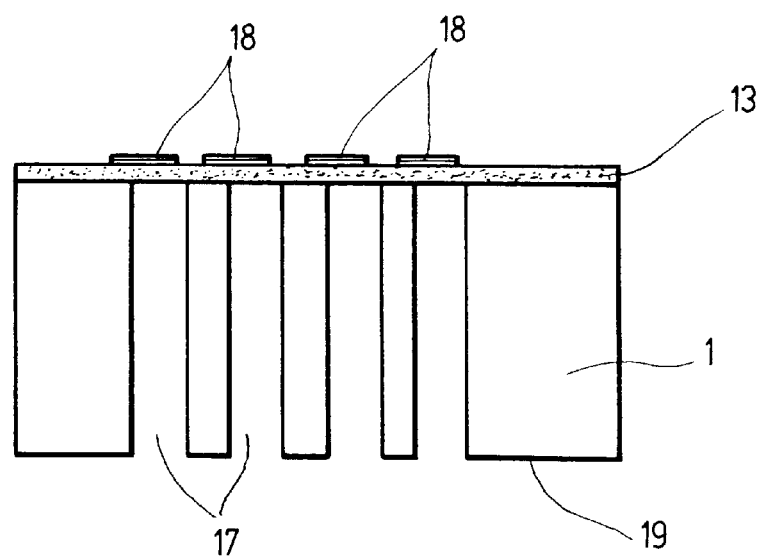
FIG. 4 shows a schematic cross section through a radiation sensor with a plurality of sensor elements produced by a method wherein the semiconductor substrate is structured from the rear side.

FIG. 4 shows in cross section and in a highly schematic form a radiation sensor produced by another method according to the present invention, whereby openings are created from the rear side through a semiconductor substrate 1 coated with a membrane 13. The sensor shown in FIG. 4 includes multiple sensor elements 18 which are shown schematically as rectangles on membrane 19 in the figure, each of which has the design shown in FIG. 1 with a radiation absorber 5 on the membrane above opening 17 and a plurality of thermoelements, each having a hot contact in thermal contact with the radiation absorber and a cold contact arranged over the solid semiconductor material.

Such an infrared sensor is produced by applying a mask to surface 19 of semiconductor substrate 1 opposite membrane 13, the mask having a congruent opening for the defined area where one of the openings 17 is to reach the opposite membrane covered surface of substrate 1, and by performing an anisotropic dry etching process from surface 19 until semiconductor substrate 1 has been eroded down to membrane 13 in openings 17. This dry etching process is preferably a plasma etching process such as that described in German Published Patent Application No. 42 41 045. The particular feature of this etching process is that between individual etching steps, polymerization steps are inserted where the areas exposed in the preceding etching step, i.e., the bottoms and the walls of etched recesses, are covered uniformly with a polymer. This is preferably a fluorinated polymer. This polymer layer on the etching edges or etching surfaces forms a very effective preliminary etching stop. During the subsequent etching step, the polymer coating on the bottom of the recess is exposed to ion bombardment from a plasma and is eroded so that the bottom of the recess is then unprotected again. The walls of the recess, however, are bombarded by ions in glancing incidence, so that etching proceeds much more slowly here, and the material etched away is deposited again for the most part on the walls of the recess in the immediate vicinity. In this way, the polymer layer on the wall of the recess expands in depth during the etching step and protects the walls from erosion, while the etching proceeds unhindered on the bottom of the recess. As soon as the thickness of the polymer layer on the walls has become too small to guarantee effective protection, etching is interrupted and a new polymerization step is added. In this way, openings in a silicon substrate with a high aspect ratio and very steep walls can be produced easily.

FIGS. 5a through 5d show various stages of another method according to the present invention for producing a radiation sensor, where openings are etched through a semiconductor substrate 1 starting from rear surface 19. FIG. 5a shows the substrate before the start of the etching process, with a membrane 13 on the surface of the substrate opposite surface 19 and a plurality of sensor elements 18 on membrane 13.

A masking layer 20 is applied to surface 19 of substrate 1 and has an opening which exposes a contiguous area 21 of the substrate opposite sensor elements 18.

This contiguous area 21 is eroded with the help of any desired suitable etching method, e.g., by one of the dry etching methods described above or by anisotropic wet etching, thus exposing a second surface 22 in a recess in the substrate. This condition is illustrated in FIG. 5b. Then in a subsequent step, another masking layer 23 is deposited on second surface 22 and structured by forming a plurality of caverns or openings 24 in it, essentially congruent with the openings which are to be formed in semiconductor substrate 1. FIG. 5c illustrates this stage. Masking layer 23 is advantageously applied by a dispensing method such as that described in the German Application No. 197 52 926.7. In this process, a preselected quantity of resist is applied to each cavern and is distributed on the bottom of the cavern. The device scans the entire wafer and injects the selected quantity of resist into each cavern. Photostructuring of the resist can then be performed with projecting lithography methods, e.g., projection exposure or stepper exposure.

This is followed by an anisotropic etching process similar to that described above in conjunction with FIG. 4, where steep-walled recesses are created in congruent openings 24 in the semiconductor substrate until reaching membrane 13, whereupon the etching process stops.

After removing second masking layer 23, the radiation sensor illustrated in FIG. 5d is obtained with a plurality of sensor elements 18, each arranged over one of openings 17. Openings 17 are separated by steep-walled webs 25, whose thickness is much smaller than that of the substrate, which is typically 700 μm, but is still fully sufficient even at a value of 50 to 220 μm to form a heat sink for the cold contacts of sensor elements 18.

Figure 5:
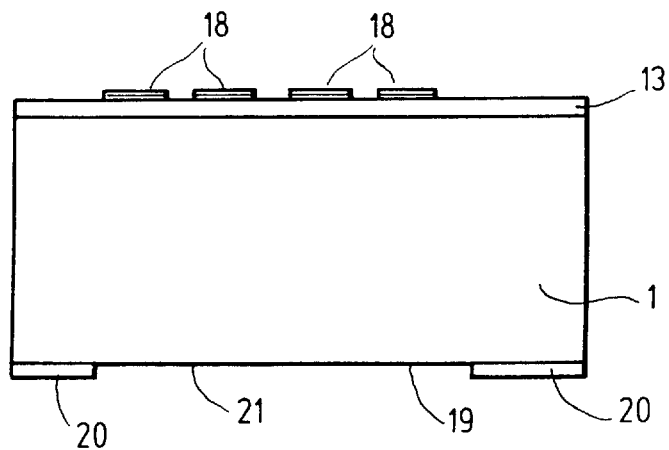
FIG. 5 shows the implementation of steps in a first embodiment of a production process by structuring a substrate from the rear side according to the present invention.
Figure 5:
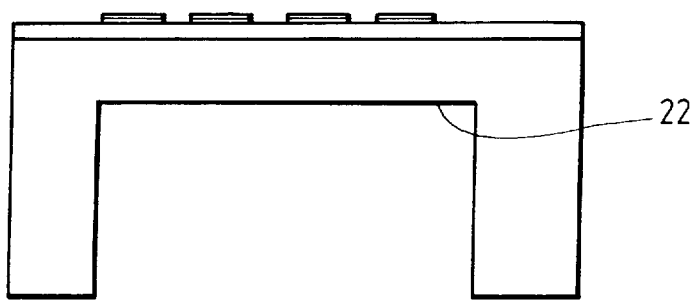
Figure 5:
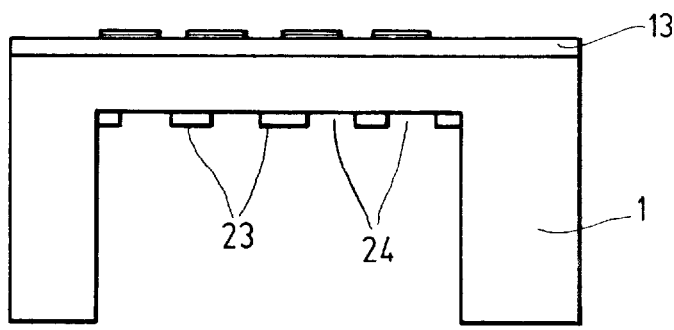
Figure 5:
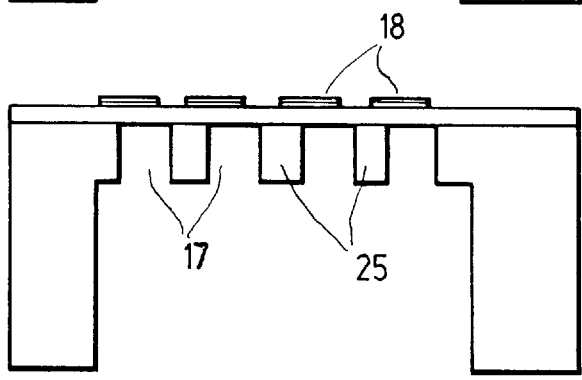
Figure 6:
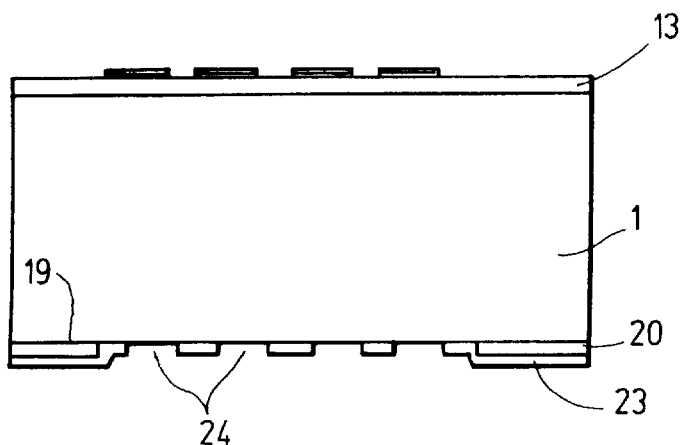
FIG. 6 shows the implementation of steps in a second embodiment of such a method.
Figure 6:
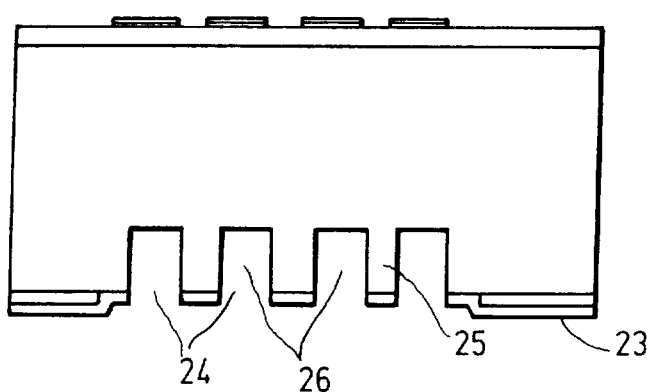
Figure 6:
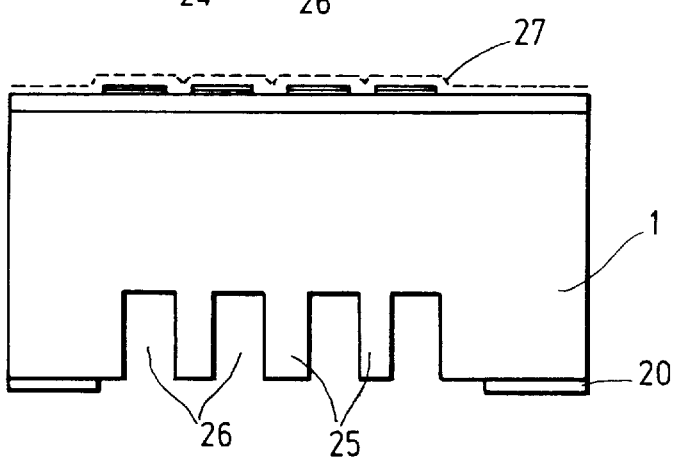
Figure 6:
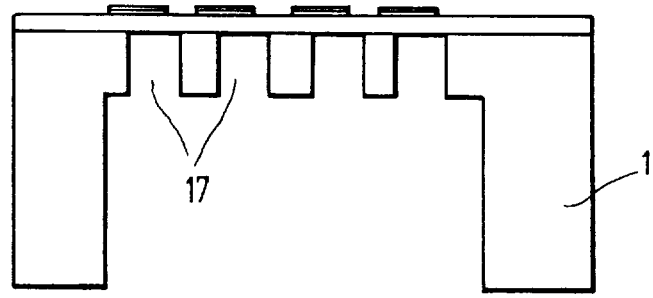

In the method illustrated in FIG. 6, first two masking layers 20 and 23 are applied to surface 19 of substrate 1, where layer 20 formed by $SiO_2$ has a large contiguous opening in the case of FIG. 5, and layer 23 of photoresist has a plurality of openings 24, each congruent with openings which are to be made through the entire thickness of substrate 1 as far as membrane 13 on the opposite surface in the course of the production process.

Then an anisotropic plasma etching process of the type described in conjunction with FIG. 4 is carried out at the surface until steep-walled recesses 26 with a desired depth of 50 to 100 μm, for example, have been formed in openings 24 (FIG. 6b).

Then masking layer 23 is removed selectively so that only masking layer 20 remains (FIG. 6c).

After removing masking layer 23, the plasma etching process is continued, with both the bottoms of recesses 26 and the tops of webs 25 remaining between these recesses being removed at essentially the same rate through the large window in layer 20. The etching process has only a negligible effect or none at all on the perpendicular walls of webs 25. Thus the etching process is continued through substrate 1 until the recesses have reached membrane 13 and desired openings 17 beneath sensor elements 18 are finished. Webs 25 formed between openings 17 also have essentially a height of 50 to 100 μm and the same width as they had at the time of removal of masking layer 23.

The finished radiation sensor illustrated in FIG. 6d corresponds to that from FIG. 5d.

For the fabrication processes described with respect to FIGS. 4 through 6, preferably an apparatus is used which makes it possible to cool the surface of substrate 1 which is facing away from the etching plasma, e.g., by using helium gas circulating in an interspace between the substrate and a substrate electrode. This cooling gas may be under a higher pressure than the etching plasma, which leads to a pressure load on membrane 13 in the area of openings 17, especially toward the end of the etching process. Therefore, it is preferably for a stabilizing layer which absorbs a pressure load of membrane 13 to be provided on membrane 13 at least toward the end of the plasma etching process. This stabilizing layer is indicated with reference number 27 in FIG. 6c, for example. This stabilizing layer 27 may be a resist layer, e.g., a photoresist, which is applied by spin coating to the entire surface of membrane 13 before etching.

What is claimed is:

1. A method of producing an infrared sensor on a semiconductor substrate, comprising the steps of:
    defining at least one area on a surface of the semiconductor substrate where a recess is to be created in the semiconductor substrate;
    causing a semiconductor material of the semiconductor substrate to become porous in the defined at least one area; depositing a membrane on the surface of the semiconductor substrate;
    applying a radiation absorber on the membrane in the defined at least one area;
    applying a plurality of thermoelements with a hot contact in thermal contact with the radiation absorber and a cold contact in thermal contact with the semiconductor substrate;
    forming an opening in the membrane in the defined at least one area; and
    etching the semiconductor substrate through the opening in the membrane.

2. The method according to claim 1, wherein the step of etching includes the step of wet etching the porous semiconductor material.

3. The method according to claim 1, wherein the step of causing the semiconductor material to become porous includes the step of performing an anodic oxidation in the defined at least one area.

4. The method according to claim 3, wherein the step of defining the at least one area includes the step of:
    masking the surface of the semiconductor substrate with a protective layer of a material that is resistant to an agent used to make the semiconductor material porous.

5. The method according to claim 4, wherein the protective layer includes one of chromium and gold.

6. The method according to claim 1, wherein the step of defining the at least one area includes the step of performing an n-type doping of a plurality of areas of the surface of the semiconductor substrate that are not to be recessed.

7. The method according to claim 6, wherein the semiconductor substrate is p type.

8. The method according to claim 6, further comprising the step of
    performing a low level of n-type doping providing a magnitude of less than $10^{14}$ cm$^{-3}$.

9. The method according to claim 1, wherein the at least one area to be recessed is defined by the step of forming the opening in the membrane.

10. A method of producing an infrared sensor on a semiconductor substrate, comprising the steps of:
    defining at least one area on a first surface of the semiconductor substrate where an opening is to be created in the semiconductor substrate;
    depositing a membrane on the first surface of the semiconductor substrate;
    applying a radiation absorber to the membrane;
    applying a plurality of thermoelements with a hot contact in thermal contact with the radiation absorber and a cold contact in thermal contact with the semiconductor substrate;
    applying a mask to a second surface of the semiconductor substrate that is opposite the first surface, the mask having a respective one of a plurality of openings congruent with each one of the defined at least one area; and
    performing an anisotropic dry etching operation of the second surface until the semiconductor substrate has been eroded in the defined at least one area,
    wherein the step of performing the anisotropic dry etching includes the steps of:
        etching only in the plurality of congruent openings of the mask, and
        etching a contiguous area of the semiconductor substrate containing several of the plurality of congruent openings.

11. The method according to claim 10, wherein the step of etching in the plurality of congruent openings is performed to a depth of 50 to 200 μm.

12. The method according to claim 10, wherein the mask includes:
    a first layer including an opening corresponding to the contiguous area, and
    a second layer in which the plurality of congruent openings are formed.

13. The method according to claim 10, further comprising the step of:
    applying a stabilizing layer to the membrane during the performance of the anisotropic dry etching operation.

* * * * *